(12) United States Patent
Boden et al.

(10) Patent No.: US 6,707,103 B1
(45) Date of Patent: Mar. 16, 2004

(54) LOW VOLTAGE RAD HARD MOSFET

(75) Inventors: Milton Boden, Redondo Beach, CA (US); Iulia Rusu, North Hollywood, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/263,916

(22) Filed: Mar. 5, 1999

Related U.S. Application Data

(60) Provisional application No. 60/076,877, filed on Mar. 5, 1998.

(51) Int. Cl.$^7$ .................... H01L 29/76; H01L 29/94
(52) U.S. Cl. .............................. 257/341; 257/342
(58) Field of Search .................. 257/341, 342; 438/137, 268

(56) References Cited

U.S. PATENT DOCUMENTS

| | | | |
|---|---|---|---|
| 4,789,882 A | * 12/1988 | Lidow | 257/341 |
| 5,338,693 A | 8/1994 | Kinzer et al. | 438/268 |
| 5,475,252 A | 12/1995 | Merrill et al. | 257/341 |
| 6,140,679 A | * 10/2000 | Ferla et al. | 257/341 |
| 6,165,821 A | * 12/2000 | Boden, Jr. et al. | 438/137 |

OTHER PUBLICATIONS

"Semiconductor devices–Physics and Technology" by Sze, 1985, pp. 417–420.*

* cited by examiner

*Primary Examiner*—Steven Loke
(74) *Attorney, Agent, or Firm*—Ostrolenk, Faber, Gerb & Soffen, LLP

(57) ABSTRACT

A radiation resistant MOSFET is formed by a reduced mask process in which gate oxide is formed after the high temperature diffusion steps needed to diffuse the base and source regions. The base diffusion depth is substantially less than 3.0 microns and preferably is about 1.3 microns.

Self alignment to hard oxide edge, instead of poly, can be used.

6 Claims, 6 Drawing Sheets

LOW VOLTAGE RAD HARD MOSFET

RELATED APPLICATIONS

This application claims the benefit of U.S. Provisional Application No. 60/076,877, filed Mar. 5, 1998.

BACKGROUND OF THE INVENTION

This invention relates to MOSFET devices and more specifically relates to a novel MOSFET structure and process for its manufacture which makes the device more capable of operation in a high radiation environment.

Semiconductor devices, and particularly power MOSFETs, require special manufacturing techniques to permit their operation in high radiation environments such as, but not limited to, those encountered in outerspace environments such as orbiting satellites. U.S. Pat. Nos. 5,338,693 and 5,475,252 in the names of Merill and Spring, and patent application Ser. No. 09/020,837, filed Feb. 9, 1998 (IR 1444) in the names of Boden and Xu describe such MOSFETS.

SUMMARY OF THE INVENTION

The present invention is for a lower voltage (250 volts or lower) "rad hard" MOSFET in which an ultrashallow channel or base region is employed. The depth of the new base is reduced to about 1.3 microns as compared to known devices employing a depth of 3.0 microns. A striped base pattern, rather than a cellular pattern is also preferably employed.

It has been found that the new device has a 50% improvement in total dose radiation resistance, as compared to prior art devices. Further, a reduced mask count process (7 masks instead of 9 masks) is also employed.

DETAILED DESCRIPTION OF THE DRAWINGS

Figure 1:
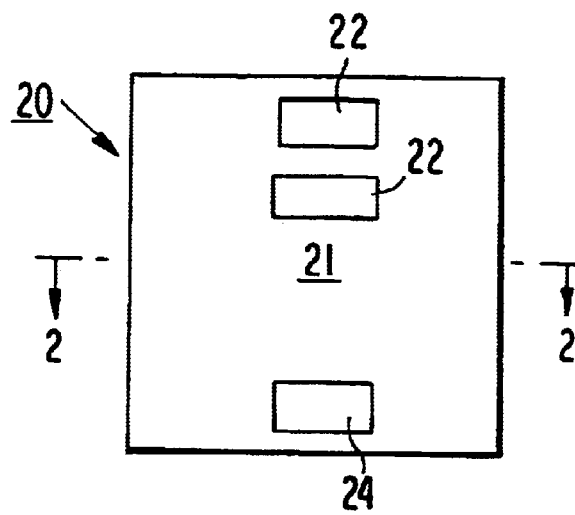
FIG. 1 is top view of a chip made in accordance with the present invention.
Figure 2:
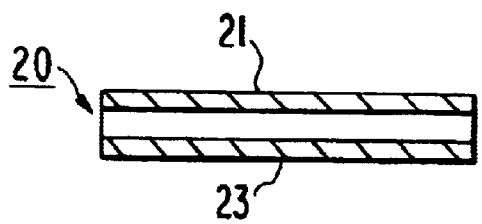
FIG. 2 is a cross-section of the chip of FIG. 1 taken across section line 2—2 in FIG. 1.

Referring first to FIGS. 1 and 2, there is shown a die 20 which is a power MOSFET for use in a high radiation environment. MOSFET 20 has a top source electrode 21, two source pads 22 (FIG. 1) to which bond wire connection can be made to source 20, a bottom drain contact 23 (FIG. 2) and a gate pad 24 (FIG. 1) to which a gate lead wire can be bonded.

Figure 3:
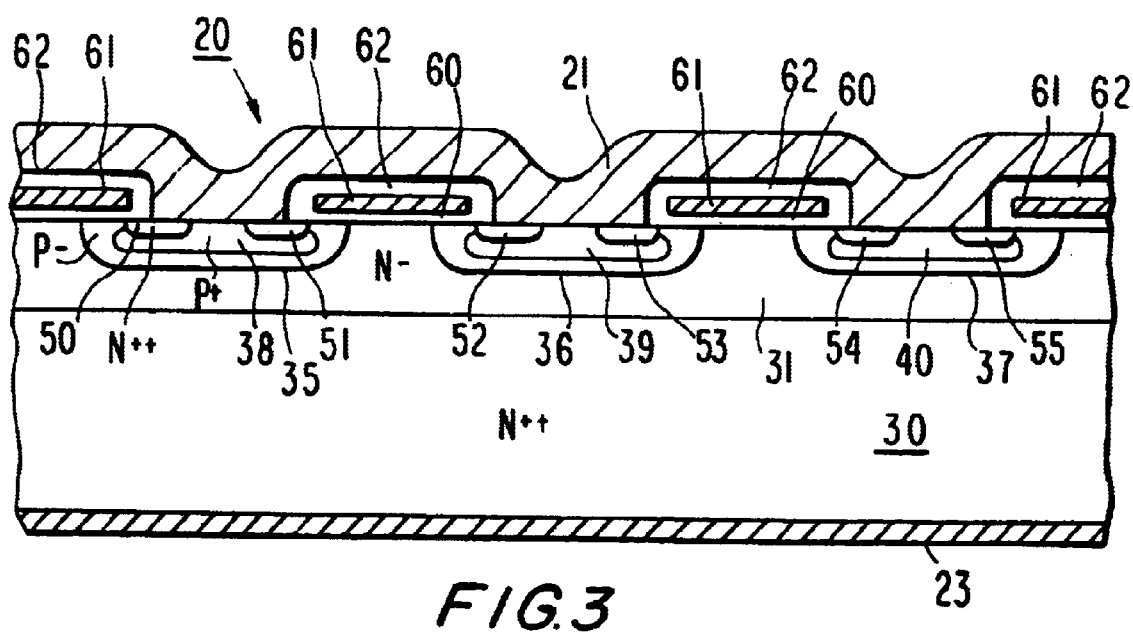
FIG. 3 is a cross-section of a small portion of FIG. 1 and 2 and shows several diffused base elements.
Figure 4:
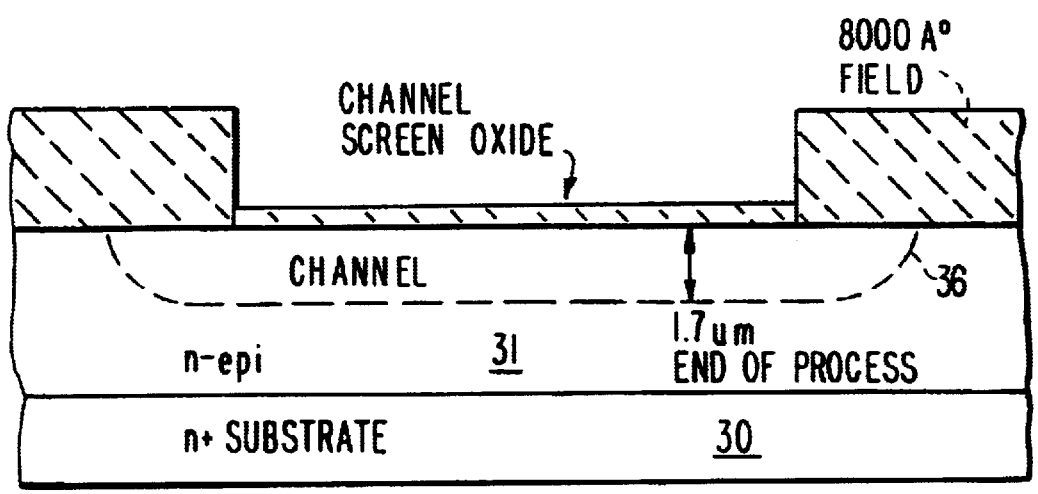
FIG. 4 is a cross-sectional view, across one base (or channel) stripe of FIG. 3 at the first mask step for forming the channel of the invention.
Figure 5:
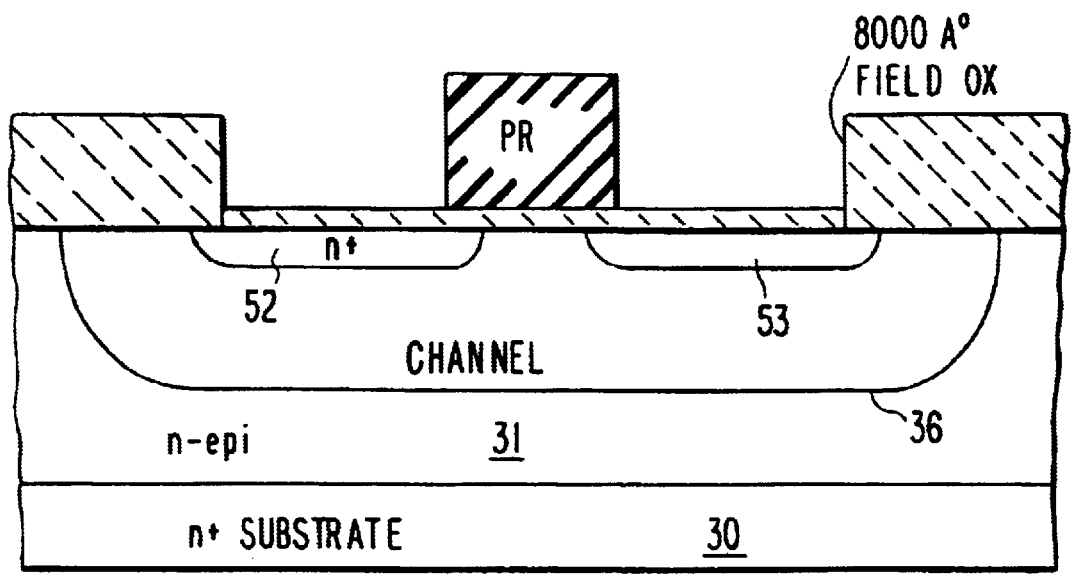
FIG. 5 is a cross-sectional view like that of FIG. 4 after a second mask step for forming the source diffusion in the channel.
Figure 6:
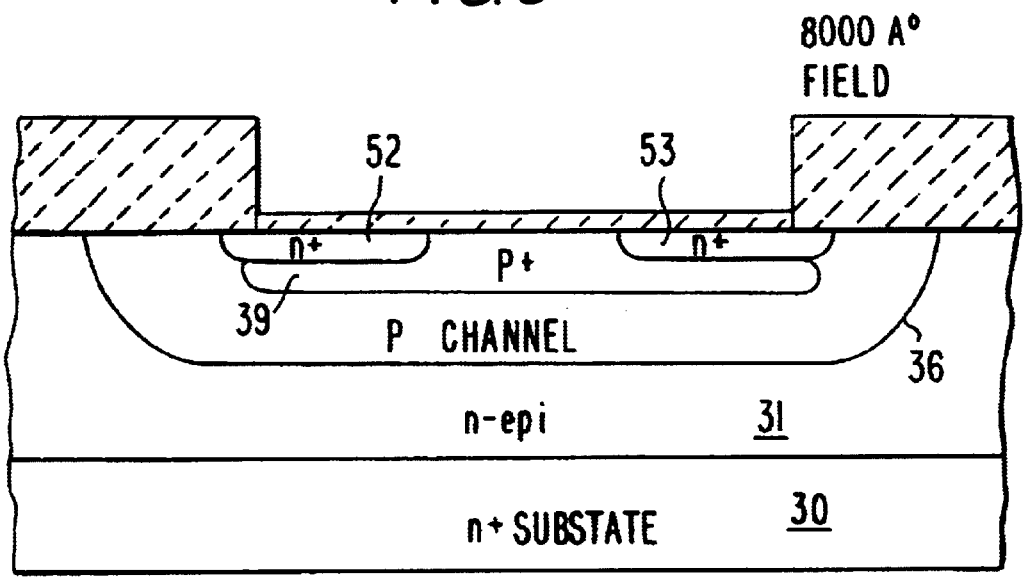
FIG. 6 is a cross-sectional view and shows the structure of FIG. 5 following a P+ blanket implant and drive.
Figure 7:
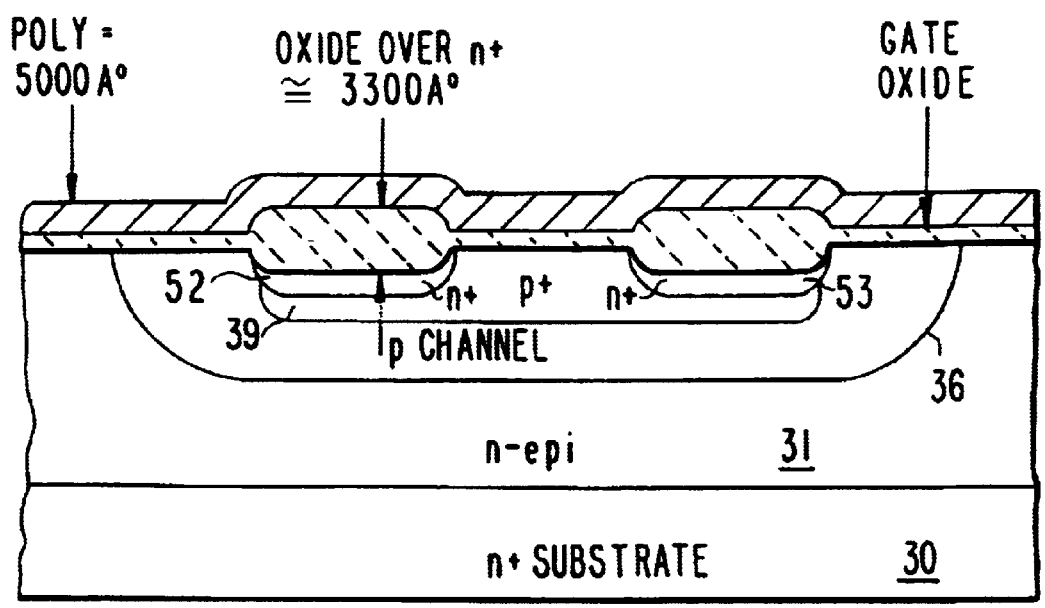
FIG. 7 shows the structure of FIG. 6 after mask 3 for the forming of the active area and gate polysilicon.
Figure 8:
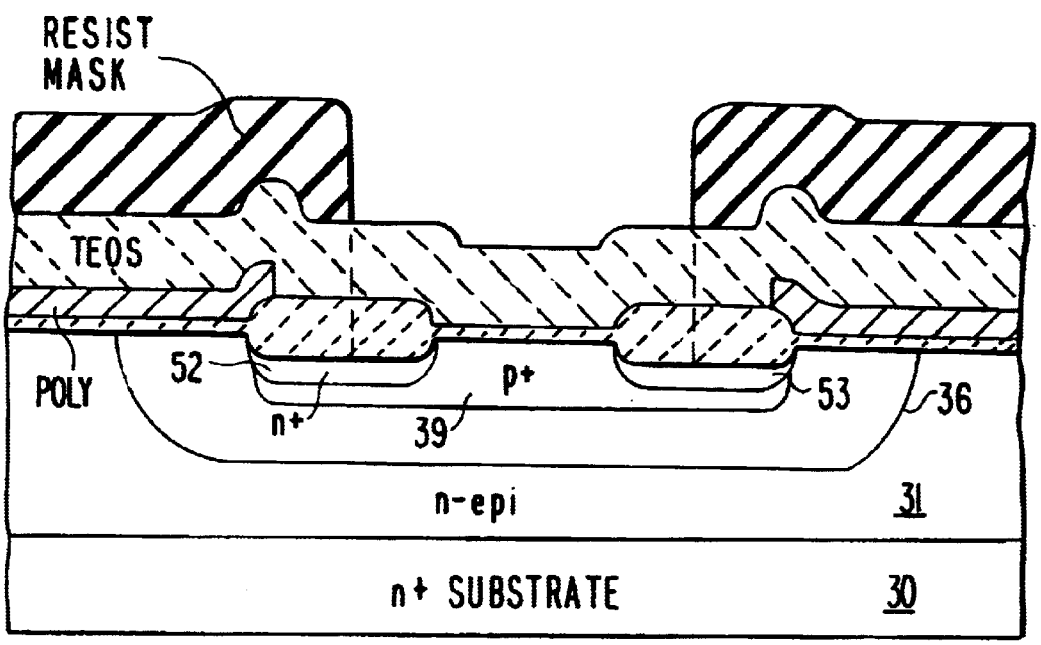
FIG. 8 shows the structure of FIG. 7 after poly mask 4, poly etch the application of an interlayer insulation, and the application of a photoresist layer.
Figure 9:
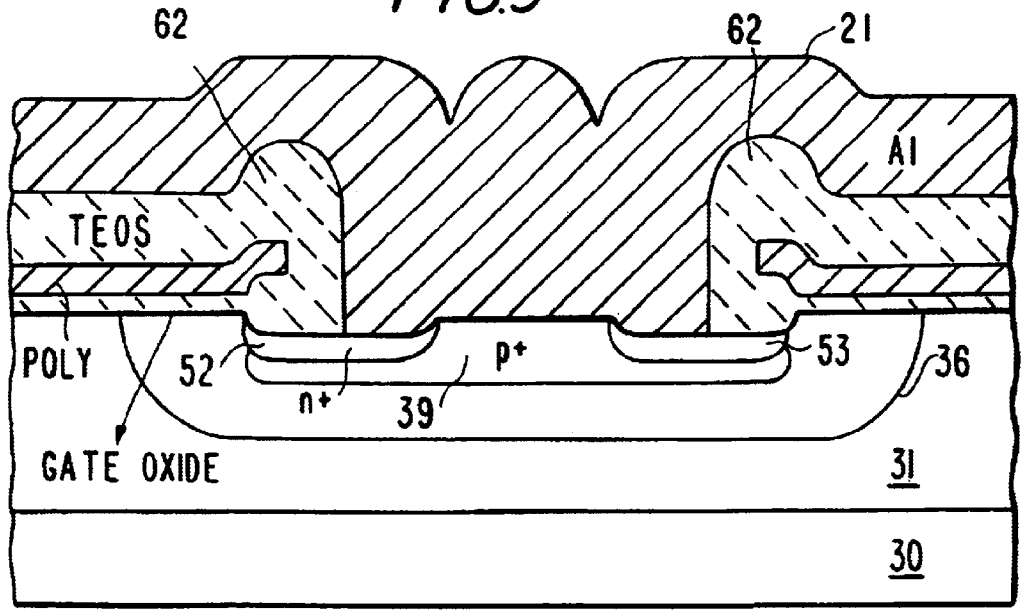
FIG. 9 shows the structure of FIG. 8 after a contact etch and a metal mask 6 step.

FIG. 3 shows a greatly enlarged portion of a minute section of FIGS. 1 and 2 to show several parallel cells of the device. Thus, in FIG. 3, there is shown the chip 20 as comprised of a highly conductive N+ substrate 30 having an N⁻ epitaxial layer 31 deposited thereon. Three P⁻ bases 35, 36 and 37 are diffused into layer 31 (a junction receiving layer). Bases 35, 36 and 37 are preferably parallel strips, but could be polygonal cells. P+ regions 38, 39 and 40 are formed in P⁻ regions 35, 36 and 37 respectively, to act as contact regions and to reduce the device $Rb^1$ as is well known. Each of base regions 35, 36 and 37 receive pairs of N+ source strips 50–51, 52–53 and 54–55 to define pairs of invertible channel regions, each leading to vertical common conduction regions for conducting carriers from the sources to drain electrode 23 when the channel regions are inverted. The channel regions are covered by a thin gate oxide layer 60 which is in turn covered by a conductive polysilicon gate electrode 61. The polysilicon electrode 61 is in turn covered by an insulation interlayer 62 which insulates the polysilicon gate mesh 61 from source electrode 21.

It is known that the radiation resistance of the MOSFET of FIGS. 1, 2 and 3 is increased if the gate oxide layer 60 is not exposed to the high temperature drives needed to form the various base and source diffusions. It is further desirable to reduce the total number of mask steps used to make the device of FIGS. 1, 2 and 3.

FIGS. 4 to 9 and 12 show a novel process for manufacturing the device of FIGS. 1, 2 and 3 with a minimum number of mask steps and with a late gate oxide process. Further, the novel process and device of the invention employs a reduced depth for bases 35, 36 and 37 of less than about 3.0 microns, preferably 1.3 microns. More specifically, FIGS. 4 to 9 and 12 show the process steps in connection with the base cell or strip 36, where the numerals of these Figures represent the same elements as in FIGS. 1, 2 and 3.

The process steps used to form stripe 36 of the plural parallel stripes are described in the following table with reference being made to FIGS. 4 to 9 and 12. Steps 1 and 2 are introductory steps, while steps 3 to 8 selectively employ 6 masks of the 7 mask process. The last steps 9 (Mask 7) and 10 complete the device.

The Process Description is as follows:

| STEP | PROCESS DESCRIPTION | COMMENTS |
|---|---|---|
| 1 | STARTING WAFER INFORMATION EPI: P doped 0.237 ± 0.012% OHM-CM, 5.75 ± 5%. SUBSTRATE RESISTIVITY: 0–0.003 OHM-CM | N-Epi, As/Sb doped substrate |
| 2 | FIELD OXIDATION BLOCK 1. CLEAN 2. FIELD OXIDATION | 8000 Å |
| 3 | CHANNEL BLOCK (See FIG. 4) 1. CHANNEL MASK 1 2. DRY OXIDE ETCH, PR STRIP 3. CLEAN | defines channel region |

-continued

| STEP | PROCESS DESCRIPTION | COMMENTS |
|---|---|---|
| | 4. CHANNEL SCREEN OXIDATION @ 900° C., 70 min 02 | |
| | 5. CHANNEL IMPLANT: B, 50KV, 2E14 | |
| | 6. CLEAN | |
| | 7. CHANNEL DRIVE @ 1050° C., 6 hrs., N2, slow ramps | |
| 4 | SOURCE BLOCK (See FIG. 5) | |
| | 1. SOURCE MASK 2 | protects dot |
| | 2. SOURCE IMPLANT: As, 150KV, 1E16 | |
| | 3. HOT POT STRIP | |
| | 4. SRC. DRIVE @ 975° C., 120 MIN. n2 | |
| 5 | P+ BLOCK (See FIG. 6) | |
| | 1. BLANKET P+ IMPLANT: B, 100KV, 2E15 | |
| | 2. CLEAN | |
| | 3. P+ DRIVE @ 975° C., 30 min. N2 | |
| 6 | ACTIVE AREA & GATE POLY BLOCK (See FIG. 7) | |
| | 1. ACTIVE AREA MASK 3 | opens up everything, except gate busses and termination |
| | 2. 6:1 BOE ETCH, PR STRIP | |
| | 3. CLEAN | |
| | 4. SACRIFICIAL GATE OX @ 900° C., push in 02 @ 750° C., 15 min 02 | |
| | 5. BLANKET ETCH SACRIFICIAL GATE | |
| | 6. CLEAN | |
| | 7. GATE OXIDATION @ 900° C.; push in at 750° C., 22 min H2O | 700 Å on Si monitors |
| | 8. POLY LPCVD DEPOSITION | 5000 Å |
| | 9. POLY IMPLANT: P, 80KV, 1E16 | ~15 Ω/SQ on Poly |
| | 10. CLEAN | |
| | 11. POLY DRIVE @ 900° C., 40 min N2 | |
| | 12. POLY MASK 4 | |
| | 13. DRY POLY ETCH | measure Poly line width |
| | 14. HOT POT STRIP | |
| 7 | INTERLAYER & CONTACT BLOCK (See FIG. 8, 12) | |
| | 1. PRE DIFFUSION CLEAN (NO HF) | |
| | 2. TEOS DEPOSITION (2–4% P) | 8000 Å Thick Coat |
| | 3. CONTACT MASK 5 | |
| | 4. DRY CONTACT ETCH | Sloped Profile. |
| 8 | METAL BLOCK (See FIG. 9) | |
| | 1. PRE METAL CLEAN: Mod CLNOO4 | |
| | 2. HOT ALUMINUM SPUTTERING, 1% Si | 8 um |
| | 3. METAL MASK 6 | |
| | 4. SINK ALUMINUM ETCH: etch to clear + overetch | |
| | 5. POST ALUMINUM PR STRIP | |
| | 6. WET DEFRECKLE | |
| 9 | PASSIVATION BLOCK | |
| | 1. POST ALUMINUM CLEAN | |
| | 2. LPCVD OXIDE DEPOSITION @ 420° C., 2–4% PHOS DOPED | 8000 Å |
| | 3. PAD MASK 7 | Thick Coat |
| | 4. SINK PAD ETCH | |
| | 5. POST ALUMINUM PR STRIP | |
| 10 | BACK METAL BLOCK | |
| | 1. BACK SIDE FILM REMOVAL | |
| | 2. STANDARD BACKMETAL: Ti, Ni, Ag. | |
| | 3. FINAL INSPECT. | |

Figure 12:
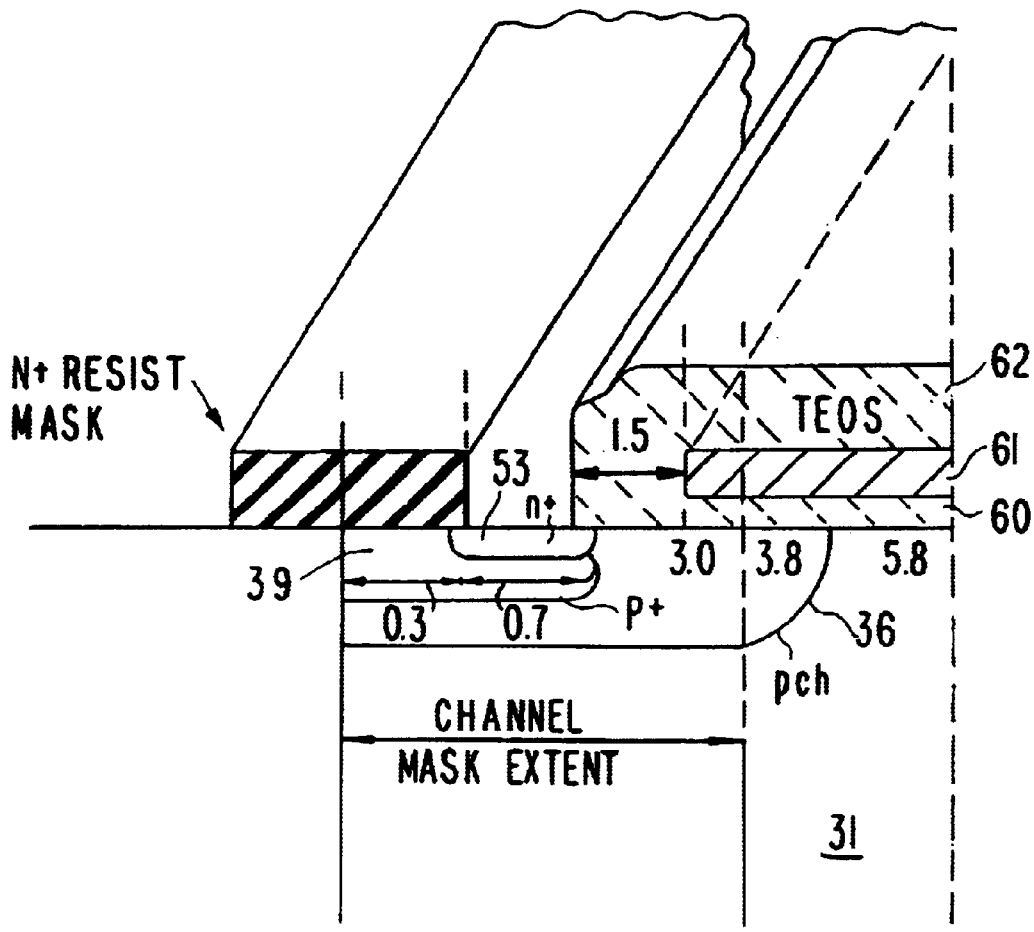
FIG. 12 is a schematic perspective view and cross-sectional view of single one half stripe-cell made in accordance with the invention.

The completed device cell will have a plurality of parallel cells, FIG. 12 showing one-half of a cell in cross-section and in partial perspective view.

Figure 10:
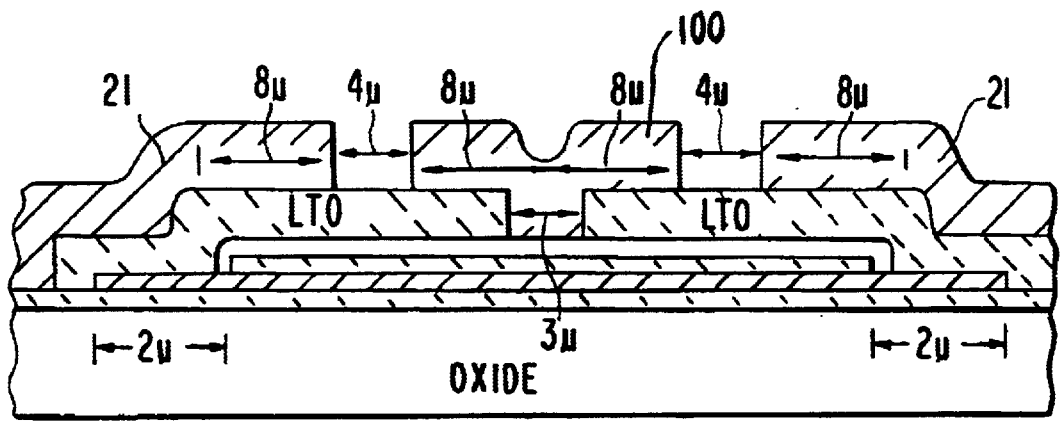
FIG. 10 shows a cross-section through the gate bus polysilicon of the device of FIGS. 1, 2 and 3 to show the termination on each side of the gate bus.
Figure 11:
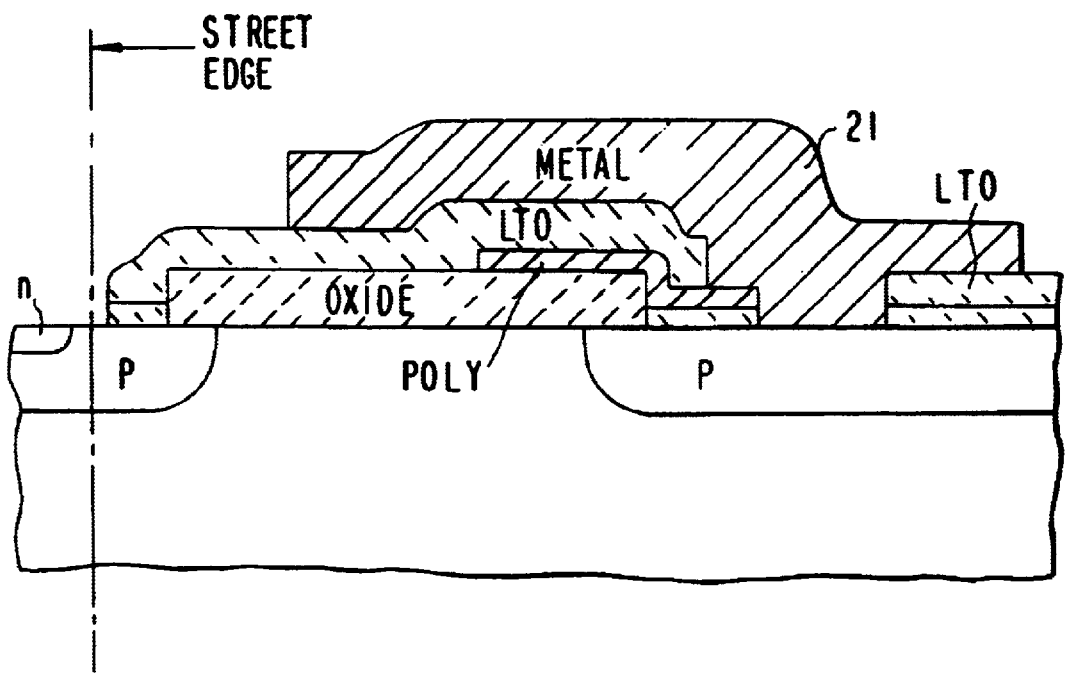
FIG. 11 shows an edge termination for the device of FIGS. 1, 2 and 3.

The top surface of the device will have a gate bus thereon and the gate bus is terminated as shown in FIG. 10 for gate bus 100. The device edge is terminated as shown in FIG. 11. These terminations are formed during the cell-forming process described above.

During the manufacturing process, the following device characteristics; the following Mask Alignment Sequence and the following "Design Rules" are used:

| Device Characteristics | Targets | Comments |
|---|---|---|
| Gate Oxide | 700 Å | |
| Channel Implant | B, 50KV, 2E14 | |
| Channel Drive | 1050 C°, 6 hrs., N2 | |
| Channel Junction Depth | 1.3 μm | |
| Source Implant | As, 120KV, 1E16 | |
| Source Drive | 975 C°, 2 hr., N2 | |
| Source Junction Depth | ~0.3 μm | |
| Channel Length | ~0.8 μm | |
| Sh P+ Implant | B, 100KV, 2E15 | |
| Sh P+ Drive | 975 C°, 30 min., N2 | |
| Sh P+ Peak Concentration | Pk 8E18 @ 0.5 μm depth | 5E18 at src junction |
| Alignment Sequence: | Primary (Preferred) Sequence; | |
| Channel Mask (1) | | |
| N+ Source Mask (2) | aligns to (1) | |
| Active Mask (3) | aligns to (1) | |
| Poly Mask (4) | aligns to (1) | |
| Contact Mask (5) | aligns to (1) | |
| Metal Mask (6) | aligns to (1) | |
| Pad Mask (7) | aligns to (1) | |
| Design Rules | | |
| Poly Linewidth | 4.6 μm | JFET width ~1.6 um |
| Poly Window | 5.0 μm | |
| Contact to Poly Spacing (cell) | 1.2 μm | |
| Poly Overlap Channel | 0.3 μm | |
| Contact Overlap Source | 0.5 μm | |
| P+ Window | 1.6 μm | |
| Metal to Metal Spacing | 6.0 μm | |
| Metal Overlap Contact | 16.0 μm | |
| Die Size: | 260 × 340 mils$^2$ | |
| Minimum Street Width | 8 mils | |
| Gate Pad Size | 20 × 20 mils$^2$ | one 6-mil wire |
| Source Pad Size | 48 × 55 and 55 × 55 mils | two 20-mil wire |

What is claimed is:

1. A radiation resistant MOS gated device comprising: a monocrystalline silicon substrate having an epitaxially formed junction-receiving layer on its upper surface, of one conductivity type, a plurality of at least partly spaced base diffusions formed into the free surface of said epitaxially formed layer; a plurality of source diffusions of said one conductivity type formed into the free surface of said epitaxially formed layer and into respective ones of said base diffusions, an edge of each of said source diffusions being laterally removed from the facing edge of their said respective base diffusion to define an invertible channel area; a radiation hardened gate oxide layer disposed on said free surface of said epitaxially formed layer and a polysilicon gate electrode layer formed atop said gate oxide layer; each said base diffusion having a depth less than 3.0 microns; said gate oxide layer and said polysilicon gate electrode layer being formed after the formation of said base and source diffusions, wherein the gate oxide layer is not exposed to a high temperature associated with the formation of said base and source diffusions.

2. The device of claim 1 wherein said device is a vertical conductive power MOSFET.

3. The device of claim 2 which further includes a continuous source contact extending over said free surface of said epitaxial layer and connected to said base diffusions and source diffusions; and a drain contact connected to the free surface of said substrate.

4. The device of claim 3 which further includes a conductive gate pad connected to said polysilicon gate electrode and one or more source pads connected to said source contact and laterally removed from atop any of said source diffusions.

5. The device of claim 4 wherein each said base diffusion has a depth of about 1.3 microns.

6. The device of claim 1 wherein each said base diffusion has a depth of about 1.3 microns.

* * * * *

UNITED STATES PATENT AND TRADEMARK OFFICE
CERTIFICATE OF CORRECTION

PATENT NO. : 6,707,103 B1
DATED : March 16, 2004
INVENTOR(S) : Milton Boden and Iulia Rusu It is certified that error appears in the above-identified patent and that said Letters Patent is hereby corrected as shown below:

<u>Title page,</u>
Item [54], Title, change "LOW VOLTAGE RAD HARD MOSFET" to
-- LOW VOLTAGE RAD HARD MOSFET AND PROCESS FOR ITS MANUFACTURE --

Signed and Sealed this

Twenty-fifth Day of May, 2004

JON W. DUDAS
*Acting Director of the United States Patent and Trademark Office*